United States Patent [19]

Strong et al.

[11] Patent Number: 4,704,548
[45] Date of Patent: Nov. 3, 1987

[54] HIGH TO LOW TRANSITION SPEED UP CIRCUIT FOR TTL-TYPE GATES

[75] Inventors: Bobby D. Strong, Garland; Robert C. Martin, Dallas; Kevin M. Ovens, Garland; James F. Salzman, Dallas, all of Tex.

[73] Assignee: Texas Instruments Incorporated, Dallas, Tex.

[21] Appl. No.: 697,303

[22] Filed: Jan. 31, 1985

[51] Int. Cl.[4] .................. H03K 19/01; H03K 19/088; H03K 17/04; H03K 17/60
[52] U.S. Cl. .................................. 307/456; 307/473; 307/443; 307/458; 307/300
[58] Field of Search ................ 307/456–458, 307/473, 280, 300, 443, 270

[56] References Cited

U.S. PATENT DOCUMENTS

| | | | |
|---|---|---|---|
| 3,461,314 | 8/1969 | Standeven et al. | 307/456 |
| 3,510,685 | 5/1970 | Watanabe et al. | 307/457 X |
| 3,524,992 | 8/1970 | Kardash | 307/456 |
| 4,081,695 | 3/1978 | Allen et al. | 307/473 |
| 4,255,670 | 3/1981 | Griffith | 307/473 |
| 4,430,585 | 2/1984 | Kirk, Jr. | 307/456 X |
| 4,486,674 | 12/1984 | Neely | 307/456 X |
| 4,521,699 | 6/1985 | Wilson | 307/456 |
| 4,591,741 | 5/1986 | Cooper | 307/456 |

FOREIGN PATENT DOCUMENTS 0122125 7/1984 Japan ..................... 307/473

Primary Examiner—Stanley D. Miller
Assistant Examiner—David R. Bertelson
Attorney, Agent, or Firm—Leo N. Heiting; N. Rhys Merrett; Melvin Sharp

[57] ABSTRACT

The specification discloses an input transistor (14) which is variable between high and low impedance states in response to input voltage transitions at terminal 10. An output transistor (16) is coupled to the input transistor (14) and is responsive to an input transition at terminal 10 for changing impedance states. Circuitry including a speed up transistor (44) is coupled between the input transistor (14) and output transistor (16) for applying added current to the output transistor (16) to speed the change of impedance state. The circuitry applies added current to output transistor (16) until the output voltage at terminal (18) falls below twice the base-emitter voltage of the output transistor (16).

13 Claims, 5 Drawing Figures

HIGH TO LOW TRANSITION SPEED UP CIRCUIT FOR TTL-TYPE GATES

TECHNICAL FIELD OF THE INVENTION

This invention relates to electronic circuitry, and more particularly relates to speed up circuitry for increasing the speed of output transition of TTL-type gates.

BACKGROUND OF THE INVENTION

Many circuits are commonly used for electronic devices wherein it is important that a rapid transition be made from one voltage level to another. Such a typical output circuit for a TTL gate might normally have a low voltage level input and a high voltage output. If a high voltage input occurs, it is important that the output circuit provides a very fast transition to a low output. It is also important that such output circuits be able to drive high capacitive loads and that a high impedance tri-state output also be provided.

Previously developed output circuits for TTL gates have been developed with "speed up" elements which apply extra speed up current to an output transistor during output transition. However, such prior speed up circuits do not apply speed up current for a sufficiently long time or of a sufficiently high magnitude, and also such previously developed speed up circuits often cannot be used as a high impedance tri-state circuit.

SUMMARY OF THE INVENTION

In accordance with the present invention, an output speed up circuit has been developed which substantially eliminates or minimizes the problems associated with previously developed output speed up circuits. The present speed up circuit includes an input transistor which is variable between high and low impedance states in response to input voltage transitions. An output transistor is coupled to the input transistor and is responsive to an input voltage transition applied to the input transistor for changing impedance states. Circuitry is coupled between the input and output transistors for applying added current to the output transistor to speed up the change of impedance state. The circuitry applies added current until the output voltage across the output transistor falls below twice the base-emitter voltage of the output transistor. The circuit may also be connected to provide a high impedance tri-state output.

In accordance with another aspect of the invention, an improved transition speed up circuit includes an input for receiving a low or a high input voltage. An input transistor is coupled to the input for becoming conductive upon a voltage transition at the input. An output transistor is coupled to the input transistor. At least one uni-directional conductive element is connected between the input and the output transistor. A speed up transistor is connected to the uni-directional conductive element and the input of the output transistor. The output transistor changes impedance states in response to current applied from conduction of the input transistor and the speed up transistor.

In accordance with another aspect of the invention, an improved transition speed up circuit includes an input transistor having a base connected to receive either a low input voltage or a high input voltage. An output transistor has a base coupled to the emitter of the input transistor. The collector of the output transistor provides an output voltage. A speed up transistor having an emitter connected to the collector of the input transistor also includes a collector which is connected to the collector of the output transistor. A high input voltage applied to the base of the input transistor causes speed up current to be applied from the speed up transistor to the base of the output transistor to speed up the conduction of the output transistor in order to quickly lower the output voltage.

BRIEF DESCRIPTION OF THE DRAWINGS

For a more detailed explanation of the present invention and for other objects and advantages thereof, reference is now made to the following drawings, taken in conjunction with the accompanying description.

DETAILED DESCRIPTION OF THE INVENTION

Figure 1:
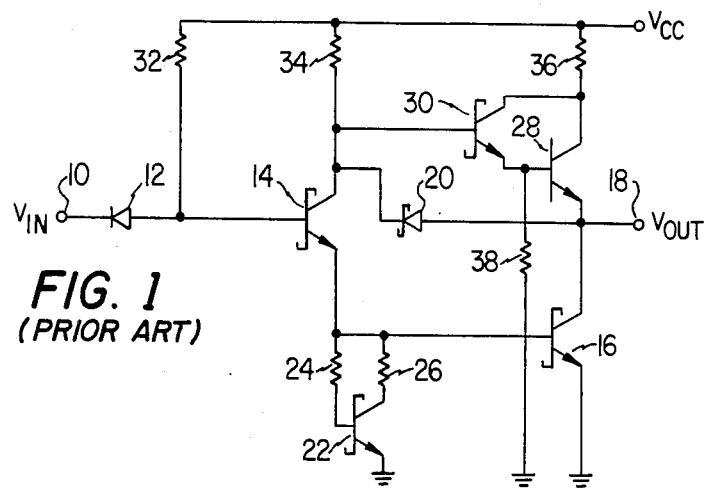
FIG. 1 illustrates the circuitry of a prior art speed up circuit for use with a TTL gate.

FIG. 1 is a schematic diagram of a prior art speed up circuit. A high or low input voltage at input terminal 10 is applied through a diode 12 to the base of a Schottky clamped input transistor 14. As is known, a Schottky clamped transistor comprises a Schottky diode connected across the base and collector of the transistor. The emitter of input transistor 14 is applied to the base of a Schottky clamped output transistor 16. The collector of transistor 16 is connected to an output terminal 18 to provide a desired output voltage to TTL circuitry.

A speed up Schottky diode 20 is connected across the collectors of input transistor 14 and output transistor 16. Diode 20 provides additional or speed up current to the base of the output transistor 16 through transistor 14 during turn on, to cause transistor 16 to become conductive more rapidly in response to voltage transitions received at input voltage terminal 10.

An active turn off Schottky clamped transistor 22 may be connected through resistors 24 and 26 to the base of transistor 16. Also, as part of a typical circuit, a Darlington pair transistor configuration is provided which includes a transistor 28 connected at its emitter to the output terminal 18 and a Schottky clamped transistor 30 connected across the base and collector of transistor 28. Resistors 32, 34, 36 and 38 provide necessary biasing and current control to the transistors of the circuit.

In operation of the prior art circuit of FIG. 1, assume that the input voltage applied to terminal 10 is low and the output voltage at terminal 18 is high. Transistors 14, 16 and 22 are nonconductive. When the input voltage applied to terminal 10 transitions to a high state, the transistor 14, which also acts as a phase splitter, becomes conductive and applies current from its emitter to the base of the output transistor 16. In addition, speed up base current is applied to transistor 16 through transistor 14 from diode 20 which also begins conduction. In response to the base current, the output transistor 16 begins to conduct, and the output voltage at terminal 18 begins to drop until finally diode 20 stops conduction. This reduces the additional speed up current applied to the base of transistor 16. At this point, the only source of turn on current being applied to output transistor 16 is through the resistors 32 and 34 and transistor 14.

It may be shown that diode 20 terminates conduction when the output voltage at terminal 18 equals the base emitter voltage of output transistor 16 plus the on voltage of input transistor 14 plus the diode voltage of diode 20. Since the on voltage of input transistor 14 approximately equals a transistor base-emitter voltage minus a Schottky diode voltage drop, then the output voltage for turning diode 20 off may be shown to be approximately twice the base-emitter voltage of the output transistor 16, since the voltage drop of diode 20 is equal to a Schottky diode voltage drop. In other words, diode 20 becomes nonconductive and stops applying speed up current when the output voltage at terminal 18 reaches approximately twice the base-emitter voltage of output transistor 16.

This threshold value of prior speed up circuits has been found to be excessively high for optimum performance, as speed up current is not applied long enough to the output transistor 16, thus lengthening the turn on time of the circuit. Moreover, the additional speed up current applied to transistor 16 is limited by the $h_{FE}$ of transistor 14. Since transistor 14 normally supplies turn on current to output transistor 16 through resistor 34, this tends to reduce the additional turn on current available for transistor 16. Moreover, the circuit shown in FIG. 1 provides difficulties when it is desired to utilize a high impedance three-state output.

Figure 2:
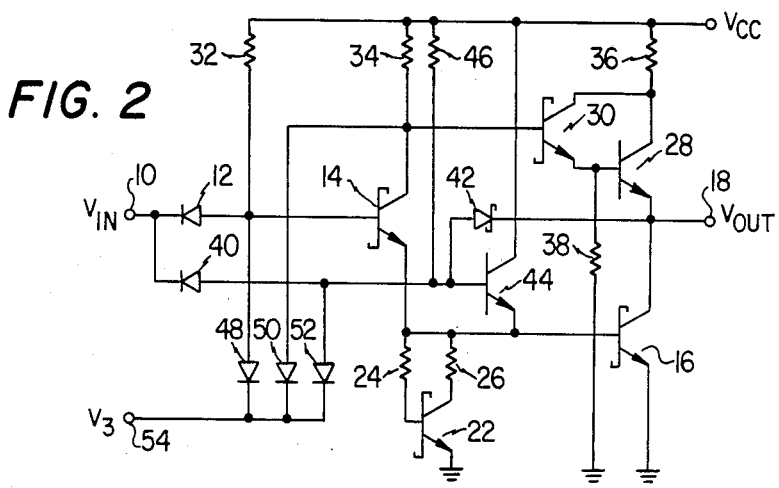
FIG. 2 is a schematic circuit of the preferred embodiment of the present improved speed up circuit.

FIG. 2 illustrates an improved circuit in accordance with the present invention wherein like numerals are used for like and identical components shown in FIG. 1. Thus, FIG. 2 includes the voltage input terminal 10, input diode 12 and input transistor 14. The emitter of transistor 14 is connected to the base of the Schottky clamped output transistor 16, the collector of which is applied to output terminal 18 to provide a voltage output. Transistor 22 is connected at its emitter and collector through resistors 24 and 26 to the base of transistor 16. A Darlington pair formed from transistors 28 and 30 is connected to the collector of transistor 16. Biasing resistors 32, 34, 36 and 38 are connected similarly as in FIG. 1.

In FIG. 2, however, the previously described diode 20 is replaced by an improved speed up circuit. The circuit comprises a diode 40 connected at its cathode to the input terminal 10 and at its anode to a Schottky diode 42. The cathode of diode 42 is tied to the output terminal 18 and to the collector of output transistor 16. A speed up transistor 44 is connected at its base to the junction of interconnected diodes 40 and 42. The emitter of speed up transistor 44 is connected to the base of output transistor 16 and the collector thereof is tied to bias voltage. A resistor 46 is connected between the base of speed up transistor 44 and the bias voltage.

In operation of the improved speed up circuit of FIG. 2, assume that the voltage applied to the input terminal 10 is low and the voltage at output terminal 18 is high. The cathode of Schottky diode 42 is a logic "one" since it is tied to the output voltage. The cathode of diode 40 is a logic "zero" since the voltage input is low. The speed up transistor 44 is thus normally nonconductive.

However, when a high voltage input is applied to the input terminal 10, the cathode of diode 40 goes to a logic "one". Diodes 40 and 42 operate to provide an AND function, so that the speed up transistor 44 is turned on only when logic "ones" are simultaneously applied to the cathodes of diodes 40 and 42. When this condition occurs, current flows from resistor 46 to the base of speed up transistor 44. Transistor 44 is connected as an emitter follower to the Schottky clamped output transistor 16 and thus applies emitter current to the base of the output transistor 16. This provides a DC speed up source for speeding up the conduction of transistor 16. Of course, upon the application of the high voltage to the input terminal 10, the input transistor 14 also begins to conduct and begins applying base current to output transistor 16 as in the previous circuit.

The present circuit provides additional speed up current to output transistor 16 because of the gain provided by transistor 44. Moreover, the speed up current is applied from transistor 44 for a longer period of time then provided by the diode 20 (FIG. 1). When the output voltage at the collector of transistor 16 falls to approximately twice the base-emitter voltage of transistor 16 minus a Schottky diode drop, only then will transistor 44 begin to turn off. This threshold level is thus substantially lower than twice a transistor base-emitter voltage. When the voltage at the collector of transistor 16 further falls, transistor 44 will become non conductive. It may thus be seen that the time of application of speed up current to output transistor 16 with the circuit of FIG. 2 is substantially longer than the prior circuitry, due to the lower threshold turn off voltage level.

In addition to these improved turn on characteristics, the circuit shown in FIG. 2 may also be used to provide a tri-state output. To provide this output, a diode 48 is connected at its anode to the base of transistor 14. A diode 50 is connected at its anode to the collector of transistor 14. A diode 52 is connected at its anode to the base of the speed up transistor 44. The cathodes of diodes 48, 50 and 52 are tied together to a $V_3$ terminal 54 to provide a high impedance tri-state output. In operation, diode 48 holds transistor 14 off, diode 50 holds off transistors 28 and 30, and diode 52 holds off transistor 44. In these states, the output transistor 16 does not have a source of base current, so the voltage output at terminal 18 is at a high impedance state and the input to the speed up circuit is a reversed biased diode so that the output can be moved up and down as desired.

The present invention may thus be seen to increase the amount of base current drive to the output transistor 16 during the turn on of the transistor 16. The current from the speed up transistor 44 during turn on of transistor 16 not only decreases the turn on time of the circuit, but allows the circuit to drive large capacitance loads with reduced effect on the turn on time. The additional turn on current is only applied during a high condition at both the input and output of the circuit, due to the AND function provided by the diodes 40 and 42.

Figure 3:
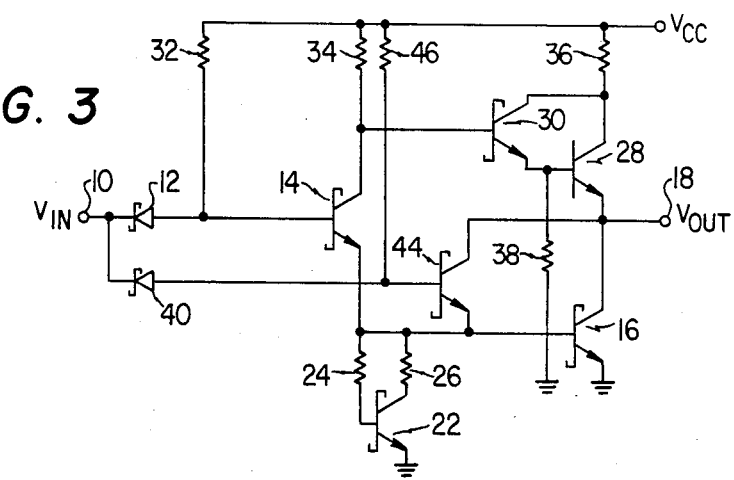
FIG. 3 is a modification of the speed up circuitry shown in FIG. 2.

FIG. 3 illustrates a variation of the circuitry shown in FIG. 2 with like numerals being utilized for like and corresponding parts of the previous Figures. As may be seen, this circuit differs from that shown in FIG. 2 by utilizing a Schottky clamped speed up transistor 44 and by tying the collector of the transistor 44 directly to the voltage output terminal 18. In addition, the tri-state circuitry comprising diodes 48–52 and terminal 54 has been eliminated from this Figure for clarity of illustration, although it should be understood that the tri-state circuitry could also be used in the circuitry of FIG. 3.

In operation of the circuitry of FIG. 3, the additional speed up current applied from speed up transistor 44 during switching of the circuit is supplied by the load on the output terminal 18 in order to assist in discharging the load. Further, the collector of speed up transistor 44 turns itself off through the base collector of the Schottky clamp incorporated therewith. This allows the diode 42 of FIG. 2 to be eliminated. With these modifications, the circuitry of FIG. 3 operates in a similar manner as the circuitry of FIG. 2 in order to provide improved speed up turn on of output transistor 16 to provide a fast transition for the output voltage at terminal 18.

Figure 4:
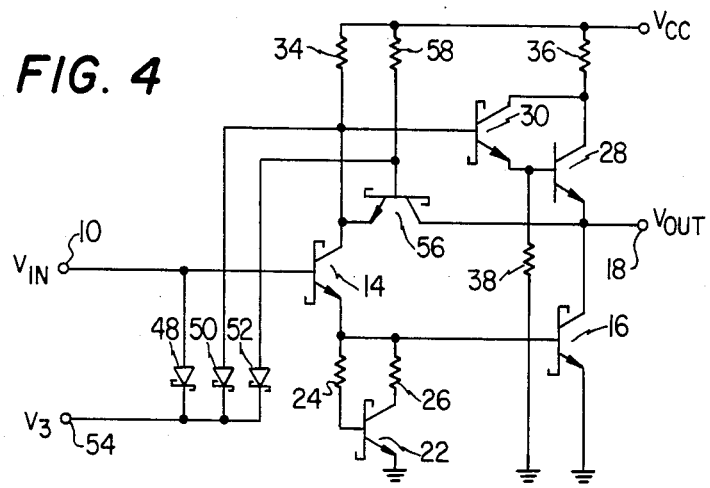
FIG. 4 is another embodiment of the speed up circuit of the present invention.

FIG. 4 illustrates another embodiment of the present invention, wherein like numerals are utilized for like and corresponding parts of the prior drawings. Input voltage is applied from terminal 10 to the base of the input transistor 14, whose emitter is tied to the base of the Schottky clamped output transistor 16. Darlington pair transistors 28 and 30 are connected as before, with resistors 34, 36 and 38 connected as with the previous circuits.

In this embodiment, however, a speed up transistor 56 has an emitter connected to the collector of input transistor 14 and also has a collector tied to the voltage output terminal 18 and the collector of output transistor 16. The transistor 56 is Schottky clamped and is connected through its base to a resistor 58 tied to bias voltage.

The tri-state circuitry previously shown in FIG. 2 is also incorporated, with diode 48 connected between the voltage input terminal 10 and the tri-state output terminal 54, diode 50 connected between the collector of transistor 14 and terminal 54 and diode 52 connected at its anode to the base of speed up transistor 50 and terminal 54. Also, in FIG. 4, diodes 48, 50 and 52 are shown to be Schottky diodes.

In this embodiment of the invention, speed up transistor 56 replaces the prior speed up diodes of previous circuits and provides additional base drive for the output transistor 16 through the input transistor 14. This speed up current is applied to output transistor 16 until the voltage output at terminal 18 reaches a transistor base-emitter voltage plus twice the on voltage of a transistor. This may be seen to be a lower threshold than the two base-emitter voltages of the prior art and thus, speed up current is applied for a longer period of time by the circuit of FIG. 4. In addition, this circuit is adaptable to a tri-state output as illustrated by the diodes 48-52 and tri-state terminal 54.

Figure 5:
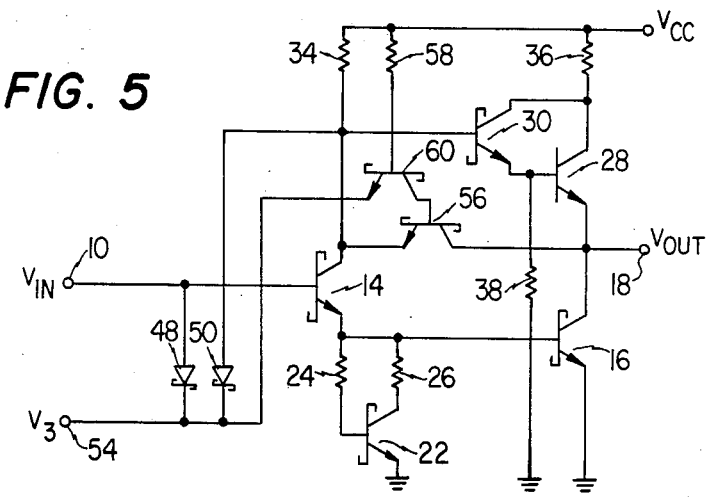
FIG. 5 is a modification of the circuitry shown in FIG. 4.

FIG. 5 is a modification of the circuitry of FIG. 4 with like numerals being used for like and corresponding parts of the prior Figures. It may be seen that the only variation in FIG. 5 from FIG. 4 is the replacement of diode 52 with a Schottky clamped transistor 60. Schottky clamped transistor 60 is connected at its collector to the base of speed up transistor 56. The emitter of transistor 60 is tied to the tri-state output terminal 54. This circuitry operates in the same manner as that shown in FIG. 4 to provide speed up current to output transistor 16. However, FIG. 5 provides an alternate way of tri-stating a circuit. Transistor 60 operates to be turned on when the tri-state is desired in order to hold off the speed up transistor 56. Diodes 48 and 50 operate to turn off the remaining circuit. Transistor 60 thus provides a very positive turn on of the circuitry to provide a high impedance state.

It will thus be seen that the present invention provides a speed up current for an extended period of time in order to provide a fast transition of an output transistor in a TTL output circuit. The present invention lowers the threshold voltage at which turn off of the speed up device occurs. The utilization of active gain devices such as transistors in place of the previously used diodes provides enhanced magnitude of speed up current, thereby further decreasing the turn off time of the circuit. The present device thus maintains speed up current to the output transistor below a threshold level of twice the base-emitter voltage of the output transistor.

Although Schottky diodes have been disclosed for use with elements such as diode 42, it will be understood that a conventional collector-base diode could be alternatively utilized. In such a case, the threshold voltage for turn off of speed up current could be lowered to approximately one base-emitter transistor voltage, as the threshold voltage equals two base-emitter voltages minus a diode voltage, and since a collector-base diode voltage equals approximately one base-emitter voltage. Of course, Schottky diodes have smaller dimensions and less required storage charge.

Although the preferred embodiment has been described in detail, it should be understood that various changes, substitutions and alterations can be made therein without departing from the spirit and scope of the invention as defined by the appended claims.

What is claimed is:

1. An improved transition speed up circuit comprising:
   an input transistor for receiving input voltage transitions from an input terminals and for producing a drive current in response thereto:
   an output transistor coupled to receive the drive current from said input transistor, said output transistor changing state in response to said drive current to thereby produce an output voltage transition at an output terminal:
   means coupled between said input and output transistors for applying added current to said output transistor to speed up said change of state, said means applying added current until the output voltage across said output transistor falls below twice the base emitter voltage of said output transistor.

2. The speed up circuit of claim 1 wherein said means for applying added current provides amplification to said added current.

3. The speed up circuit of claim 2 wherein said means for applying added current includes a transistor.

4. The speed up circuit of claim 1 wherein said means includes a pair of unidirectional conductive elements connected in series between said input and said output, and a speed up transistor connected between a junction of said unidirectional conductive elements and a base of said output transistor, conduction of said input transistor and speed up transistor causing said added current to be applied to said output transistor.

5. The speed up circuit of claim 1 wherein said means includes a unidirectional conductive element connected at one terminal to said input transistor and connected at a second terminal to a Schottky clamped transistor, said Schottky clamped transistor connected across the input and output of said output transistor.

6. The speed up circuit of claim 1 wherein said means includes a Schottky clamped transistor connected between said input transistor and the output of said output transistor.

7. The speed up circuit of claim 6 further comprising second means connected to said Schottky clamped transistor to provide a high impedance third state output.

8. The speed up circuit of claim 7 wherein said second means comprises a diode connected at its anode to the base of said Schottky clamped transistor, the cathode of said diode placing the output in a high impedance state.

9. The speed up circuit of claim 7 wherein said second means is a second Schottky clamped transistor connected at its collector to the base of said Schottky clamped transistor, the emitter of said second Schottky clamped transistor placing the output in a high impedance state.

10. A transition speed up circuit for operative connection across a voltage supply comprising:
- an input transistor for receiving input voltage transitions from an input terminal and for producing a drive current in response thereto:
- an output transistor coupled to receive the drive current to change state in response thereto produce an output voltage transition for application to an output terminal:
- a speed up circuit coupled to apply added current directly from a voltage source to said output transistor to speed up said change of state of said output transistor, including:
  and first and second diodes connected in series in opposite current conducting directions between the input and output terminals,
  a speed up transistor having a base connected to a junction of said first and second diodes, an emitter connected to a base of said output transistor, and a collector connected directly to said voltage supply, whereby conduction of said input and speed up transistors causes said added current to be applied to said output transistor until the output voltage across said output transistor falls below twice the base emitter voltage of said output transistor.

11. The speed up circuit of claim 10 further comprising means for selectively placing the output at a high impedance state.

12. The speed up circuit of claim 11 wherein said means for selectively placing the output at a high impedance state comprises a third diode connected at its anode to the base of said speed up transistor and a fourth diode connected at its anode to the base of said input transistor.

13. The speed up circuit of claim 12 wherein said input and output transistors are Schottky clamped transistors.

* * * * *

UNITED STATES PATENT AND TRADEMARK OFFICE
CERTIFICATE OF CORRECTION

PATENT NO. : 4,704,548

DATED : Nov. 3, 1987

INVENTOR(S) : Strong et al.

It is certified that error appears in the above-identified patent and that said Letters Patent is hereby corrected as shown below:

In Claim 1, line 4, delete the "s" from "terminals".

In Claim 10, line 7, after "thereto" insert --to--.

Signed and Sealed this

Twenty-second Day of May, 1990

*Attest:*

HARRY F. MANBECK, JR.

*Attesting Officer*

*Commissioner of Patents and Trademarks*